(12) United States Patent
Hirata et al.

(10) Patent No.: US 10,651,814 B2
(45) Date of Patent: May 12, 2020

(54) CONDUCTIVE PATH WITH NOISE FILTER

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventors: Keiji Hirata, Yokkaichi (JP); Takeshi Aizawa, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/094,713

(22) PCT Filed: Apr. 3, 2017

(86) PCT No.: PCT/JP2017/013907
§ 371 (c)(1),
(2) Date: Oct. 18, 2018

(87) PCT Pub. No.: WO2017/183430
PCT Pub. Date: Oct. 26, 2017

(65) Prior Publication Data
US 2019/0123706 A1    Apr. 25, 2019

(30) Foreign Application Priority Data
Apr. 22, 2016  (JP) ................. 2016-086068

(51) Int. Cl.
 *H03H 7/01*  (2006.01)
 *H05K 5/02*  (2006.01)
 (Continued)

(52) U.S. Cl.
 CPC ............ *H03H 7/0115* (2013.01); *H03H 7/01* (2013.01); *H03H 7/09* (2013.01); *H05K 5/0247* (2013.01);
 (Continued)

(58) Field of Classification Search
 CPC ...... H05K 5/0247; H03H 7/0115; H01P 1/007
 (Continued)

(56) References Cited

U.S. PATENT DOCUMENTS 9,240,765 B1 *  1/2016  Waks ................... H03H 7/0115
2015/0362096 A1 * 12/2015  Durney ............... H05K 5/0247
                                                          24/122.3

FOREIGN PATENT DOCUMENTS

JP  2010-126043 A  6/2010
JP  2012-095030 A  5/2012
JP    5850357 B1   2/2016

OTHER PUBLICATIONS

Jun. 6, 2017 International Search Report issued in International Patent Application No. PCT/JP2017/013907.

* cited by examiner

*Primary Examiner* — Rakesh B Patel
(74) *Attorney, Agent, or Firm* — Oliff PLC

(57) ABSTRACT

A conductive path includes a plurality of covered electrical conductors that are obtained by enveloping a plurality of conductive path main bodies with insulating layers; a plurality of conductors that are individually fixed to outer circumferential surfaces of the insulating layers, capacitors being formed individually between the conductors and the (Continued)

conductive path main bodies; a body having a holder; a plurality of arc-shaped positioning recesses that are formed in the holder and are configured to respectively keep the plurality of covered electrical conductors positioned; a plurality of inductors that are respectively connected to the plurality of conductors and are fixed to the body; and a connector that is formed on the inductors, is exposed in an arc shape on an inner circumferential surface of the positioning recesses, and comes into contact with the conductors in a state in which the covered electrical conductors are held in the positioning recesses.

3 Claims, 3 Drawing Sheets

(51) Int. Cl.
*H05K 9/00* (2006.01)
*H03H 7/09* (2006.01)
*H03H 1/00* (2006.01)

(52) U.S. Cl.
CPC ............ *H05K 9/00* (2013.01); *H03H 1/0007* (2013.01); *H03H 2001/0021* (2013.01)

(58) Field of Classification Search
USPC .................................. 333/175, 185, 236, 243
See application file for complete search history.

CONDUCTIVE PATH WITH NOISE FILTER

This application is the U.S. National Phase of PCT/JP2017/013907 filed Apr. 3, 2017, which claims priority to JP 2016-086068 filed Apr. 22, 2016, the entire disclosure of which is incorporated herein by reference.

BACKGROUND

The present disclosure relates to a conductive path with noise filter.

JP 2010-126043A discloses a technique with which a wire harness constituted by three-phase alternating current (AC) electrical wires is routed between a motor of an electrically driven vehicle and an inverter apparatus, the wire harness is enveloped by a braided wire as an antinoise measure in this wire harness, and both ends of the braided wire are connected to a shield case of the motor and a shield case of the inverter apparatus. If the wire harness is shielded by the braided wire in this manner, it is possible to prevent noise emitted from the motor, the inverter apparatus, and the wire harness from influencing peripheral devices and circuits.

However, it is difficult to effectively reduce surge noise in a specific frequency band generated in the inverter apparatus, using the method for enveloping the wire harness with the braided wire. In view of this, a noise filter is conceivable in which the three-phase AC electrical wires are constituted by three covered electrical wires that are each obtained by enveloping a conductive path main body with an insulating layer, a capacitor is formed between the conductive path main body and a conductor by providing the conductor on an outer circumferential surface of the insulating surface, and inductors are respectively connected to the conductors. According to this noise filter, setting electrostatic capacitances of the capacitor and inductances of the inductors as appropriate makes it possible to effectively reduce surge noise in a specific frequency band by LC resonance.

SUMMARY

Although the three-phase AC electrical wires are constituted by three covered electrical wires, if the three covered electrical wires vibrate while a vehicle is moving, positional relationships between covered electrical wires, and positional relationships between covered electrical wires and the braided wire become unstable. If these positional relationships become unstable, their electrostatic capacitances and inductances also become unstable, and thus there is a concern that the expected surge suppression effect will not be achieved.

An exemplary aspect of the disclosure achieves improvement of the reliability of a noise reduction function.

An aspect of the present disclosure includes: a plurality of covered electrical conductors that are obtained by enveloping a plurality of conductive path main bodies with insulating layers; a plurality of conductors that are individually fixed to outer circumferential surfaces of the insulating layers, capacitors being formed individually between the conductors and the conductive path main bodies; a body having a holder; a plurality of arc-shaped positioning recesses that are formed in the holder and are configured to respectively keep the plurality of covered electrical conductors positioned; a plurality of inductors that are respectively connected to the plurality of conductors and are fixed to the body; and a connector that is formed on the inductors, is exposed in an arc shape on an inner circumferential surface of the positioning recess, and comes into contact with the conductors in a state in which the covered electrical conductors are held in the positioning recess.

Positional relationships between covered electrical conductors are stabilized by positioning the plurality of covered electrical conductors using positioning members/bodies, and thereby the reliability of noise reduction performance improves. Also, the inductors and the positioning members/bodies can be easily handled when they are transported, for example. Also, when the covered electrical conductors are held by the holders, the conductors and the inductors are connected to each other, and thus an operation for connecting the conductors and the inductors is not required.

DETAILED DESCRIPTION OF EMBODIMENTS

An aspect of the present disclosure may also have a configuration in which the inductor includes a connecting electrical conductor having the connection portion and a magnetic core enveloping the connecting electrical conductor.

An aspect of the present disclosure may also have a configuration in which the inductor is disposed between the two adjacent covered electrical conductors. According to this configuration, a dead space located between two adjacent covered electrical conductors can be effectively utilized as a space for disposing the inductor.

Embodiment 1

Figure 1:
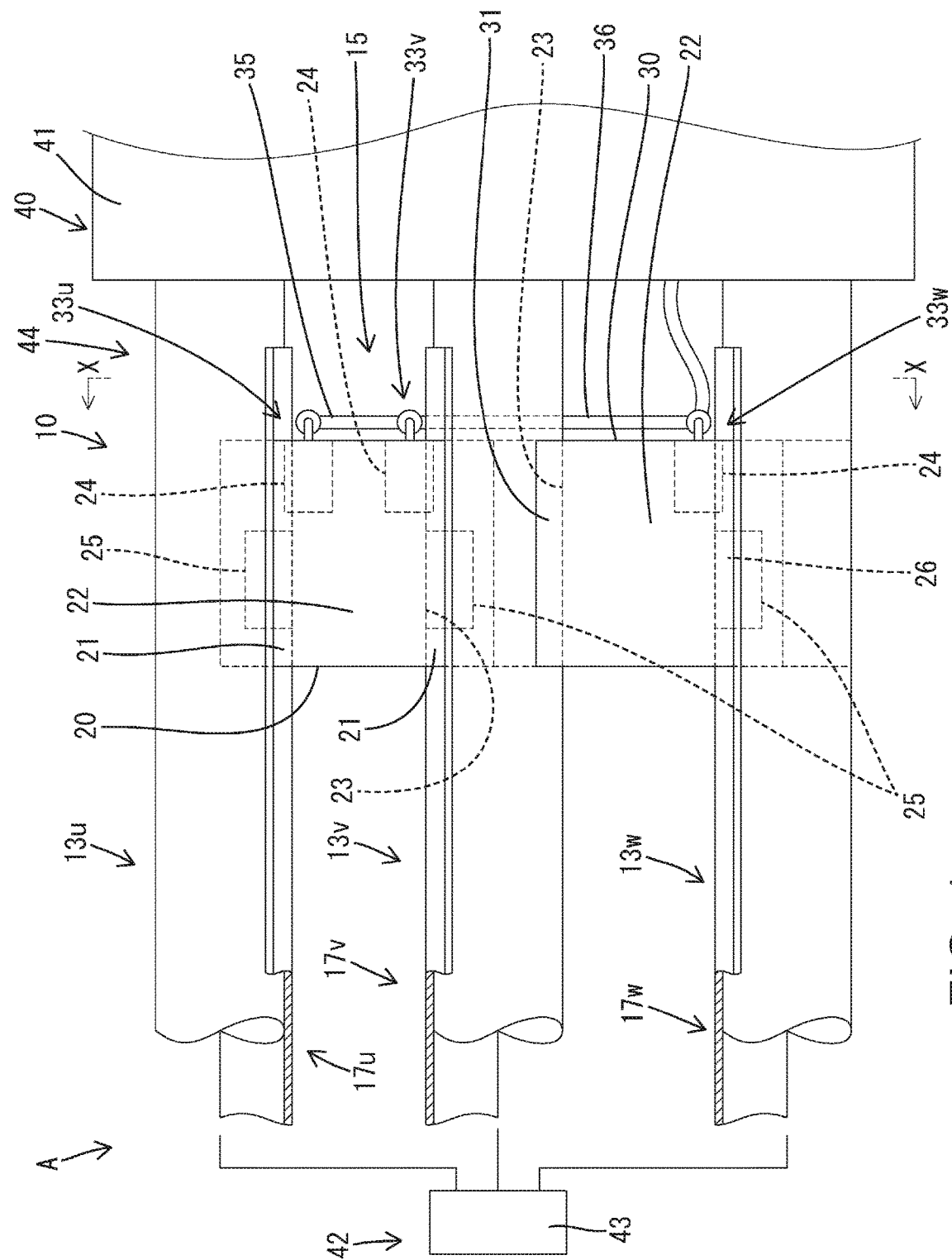
FIG. 1 is a plan view of a conductive path with noise filter in Embodiment 1.
Figure 2:
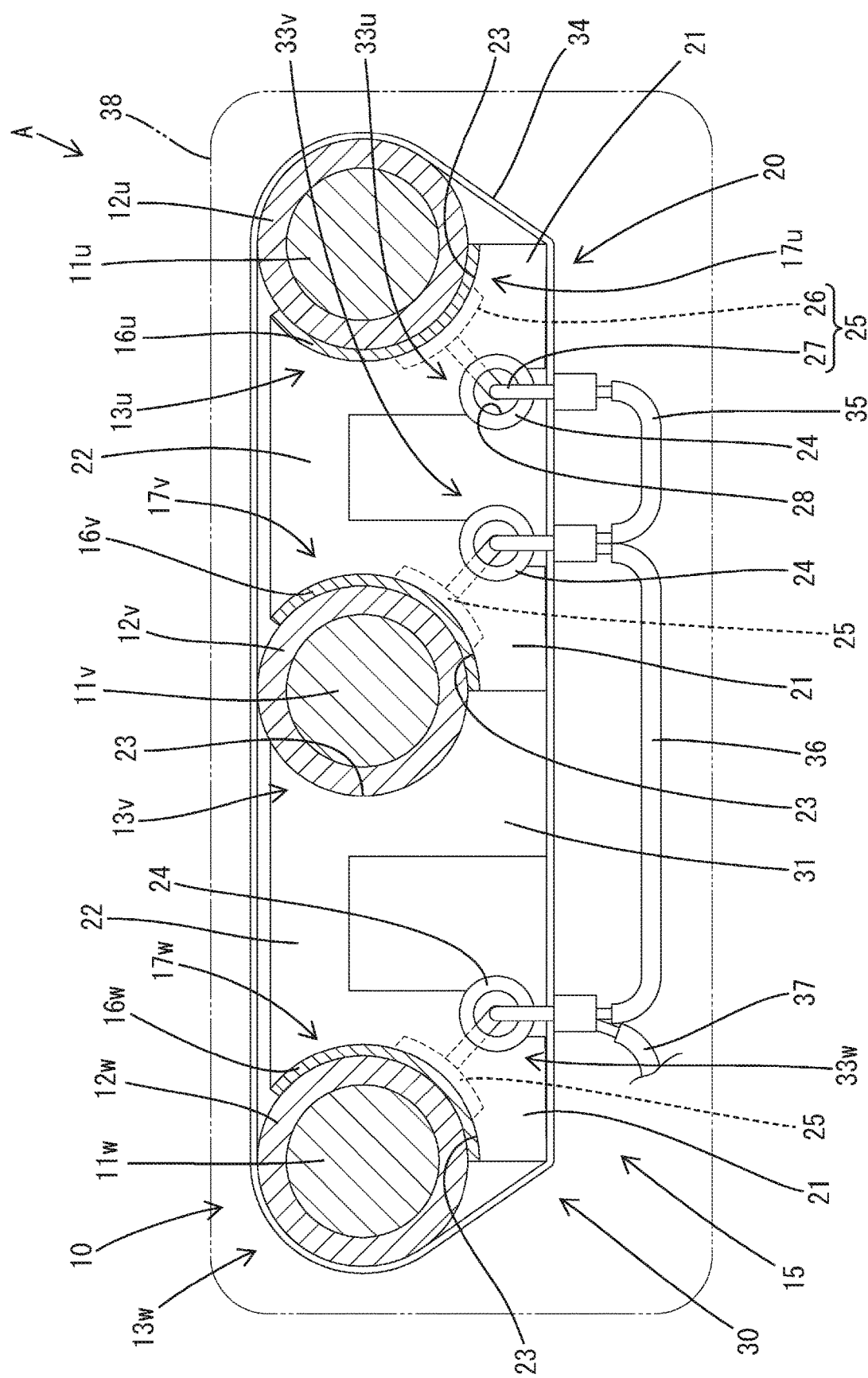
FIG. 2 is a cross-sectional view taken along line X-X of FIG. 1.
Figure 3:
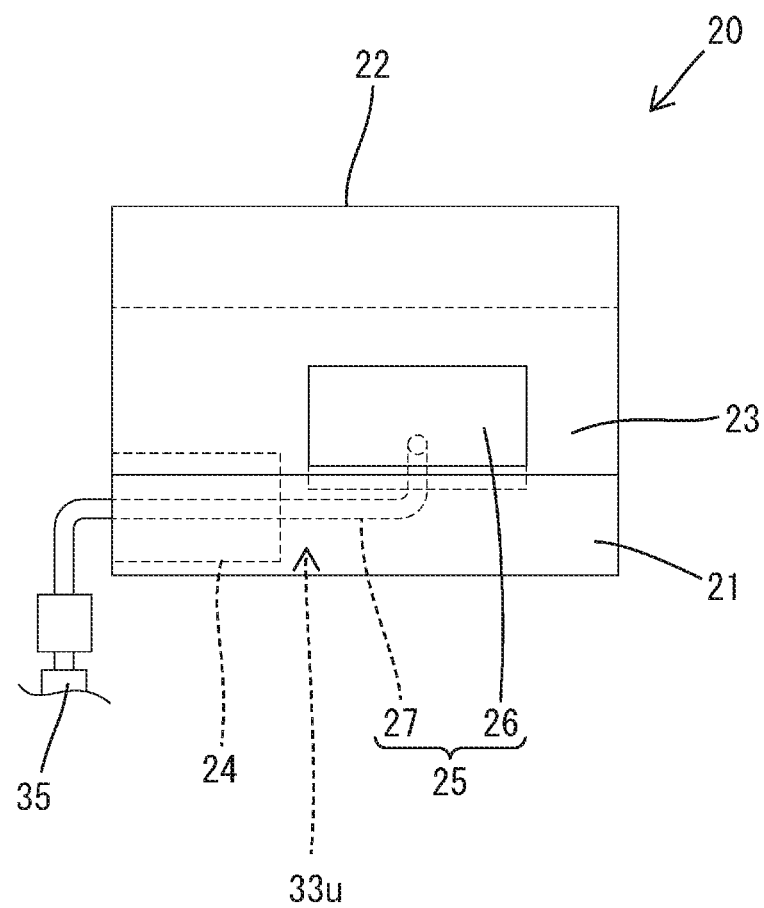
FIG. 3 is a side view of a second positioning member.

Hereinafter, Embodiment 1 embodying the present disclosure will be described with reference to FIGS. 1 to 3. A conductive path A with noise filter of Embodiment 1 is routed between a motor 40 and an inverter apparatus 42 that are installed in an electrically driven vehicle (not shown) such as an electric car or a hybrid automobile. In this electrically driven vehicle, a motor case 41 that is a housing of the motor 40, an inverter case 43 that is a housing of the inverter apparatus 42, and a shield layer 38 for connecting both cases 41 and 43 constitute a housing earth 44.

The conductive path A with noise filter includes a U phase wire 11u (a conductive path main body), a V phase wire 11v (a conductive path main body), and a W phase wire 11w (a conductive path main body) that constitute a three-phase AC circuit 10, a noise filter 15 for reducing surge, a shield layer 38, a first positioning member 20 (a positioning member/body), and a second positioning member 30 (a positioning member/body).

The U phase wire 11u, the V phase wire 11v, and the W phase wire 11w are each constituted by a twisted wire made of metal (copper, a copper alloy, aluminum, an aluminum alloy, or the like). An outer circumferential surface of the U phase wire 11u, an outer circumferential surface of the V phase wire 11v, and an outer circumferential surface of the W phase wire 11w are respectively enveloped by an insulating coating 12u for the U phase that is made of a synthetic resin (an insulating layer), an insulating coating 12v for the V phase that is made of a synthetic resin (an insulating layer), an insulating coating 12w for the W phase (an insulating layer) that is made of a synthetic resin. The U phase wire 11u and the insulating coating 12u for the U phase constitute one covered electrical conductor 13u for the U phase (a covered electrical conductor), the V phase wire 11v and the insulating coating 12v for the V phase constitute one covered electrical conductor 13v for the V phase (a covered electrical conductor), and the W phase wire 11w and the insulating coating 12w for the W phase constitute one covered electrical conductor 13w for the W phase (a covered electrical conductor).

The U phase wire 11u, the V phase wire 11v, and the W phase wire 11w are routed in parallel to each other. On end of the U phase wire 11u, the V phase wire 11v, and the W phase wire 11w is connected to an inverter circuit (not shown) of the inverter apparatus 42. The inverter circuit is accommodated in the conductive inverter case 43, which has a shield function. The other end of the U phase wire 11u, the V phase wire 11v, and the W phase wire 11w is connected to a winding wire (not shown) of the motor 40. The winding wire is accommodated in the conductive motor case 41, which has a shield function.

The noise filter 15 includes a capacitor 17u for the U phase (a capacitor), a capacitor 17v for the V phase (a capacitor recited in the claims), and a capacitor 17w for the W phase (a capacitor). The capacitor 17u for the U phase includes a conductor 16u for the U phase (a conductor) that is arranged in opposition to and near the U phase wire 11u, the insulating coating 12u for the U phase being arranged between the U phase wire 11u and the conductor 16u. The conductor 16u for the U phase constitutes the covered electrical conductor 13u for the U phase together with the U phase wire 11u and the insulating coating 12u for the U phase.

The capacitor 17v for the V phase includes a conductor 16v for the V phase (a conductor) that is arranged in opposition to and near the V phase wire 11v, the insulating coating 12v for the V phase being arranged between the V phase wire 11v and the conductor 16v. The conductor 16v for the V phase constitutes the covered electrical conductor 13v for the V phase together with the V phase wire 11v and the insulating coating 12v for the V phase. The capacitor 17w for the W phase includes a conductor 16w for the W phase (a conductor) that is arranged in opposition to and near the W phase wire 11w, the insulating coating 12w for the W phase being arranged between the W phase wire 11w and the conductor 16w. The conductor 16w for the W phase constitutes the covered electrical conductor 13w for the W phase together with the W phase wire 11w and the insulating coating 12w for the W phase.

The conductor 16u for the U phase, the conductor 16v for the V phase, and the conductor 16w for the W phase each have a sheet shape and are made of metal (copper, a copper alloy, aluminum, an aluminum alloy, or the like). The conductor 16u for the U phase, the conductor 16v for the V phase, and the conductor 16w for the W phase are respectively fixed to portions, with respect to the circumferential direction, of the outer circumferential surfaces of the insulating coating 12u for the U phase, the insulating coating 12v for the V phase, and the insulating coating 12w for the W phase. Also, these conductors 16u, 16v, and 16w are respectively provided over approximately the full lengths of the insulating coatings 12u, 12v, and 12w.

The covered electrical conductor 13u for the U phase functions as the capacitor 17u for the U phase including the U phase wire 11u and the conductor 16u for the U phase as electrodes. The covered electrical conductor 13v for the V phase functions as the capacitor 17v for the V phase (a capacitor), which includes the V phase wire 11v and the conductor 16v for the V phase as electrodes. The covered electrical conductor 13w for the W phase functions as the capacitor 17w for the W phase (a capacitor), which includes the W phase wire 11w and the conductor 16w for the W phase as electrodes.

End portions of the three covered electrical conductors 13u, 13v, and 13w on the motor 40 side are held by a first positioning member 20 and a second positioning member 30, and thereby their positional relationships are defined. The first positioning member 20 is a single component made of an insulating material such as a synthetic resin. The first positioning member 20 includes a pair of holding portions 21 for conduction (holding portions/holders) that are spaced apart from each other in a width direction (a direction intersecting the axes of the covered electrical conductors 13u, 13v, and 13w), and a linking portion 22 configured to link upper ends of the pair of holding portions 21 for conduction. The holding portions 21 for conduction are each provided with a positioning recess 23 having such a shape that an outer surface that is opposite to the counterpart holding portion 21 for conduction is recessed to an arc shape. The curvature of the positioning recess 23 is set to a curvature that is substantially equal to those of the outer circumferential surfaces of the conductors 16u, 16v, and 16w.

An annular magnetic core 24 whose axis is oriented approximately in parallel to the axes of the covered electrical conductors 13u, 13v, and 13w is fixed to an inner surface of the lower end portion of each holding portion 21 for conduction, the inner surface being opposite to the counterpart holding portion 21 for conduction. A connecting electrical conductor 25 having conductivity is integrated with each holding portion 21 for conduction through insert molding, for example. The connecting electrical conductor 25 is a single component having an arc-shaped connection portion 26 embedded in the holding portion 21 for conduction and a curved leg 27 extending from the outer circumferential surface of the connection portion 26. The inner circumferential surface of the connection portion 26 is a curved surface having a curvature that is the same as that of the inner circumferential surface of the positioning recess 23. The inner circumferential surface of the connection portion 26 is exposed on and flush with the inner circumferential surface of the positioning recess 23. A portion of the leg 27 that protrudes outward from the holding portion 21 for conduction is inserted into a central hole 28 of the magnetic core 24.

The second positioning member 30 is a single component made of an insulating material such as a synthetic resin. The second positioning member 30 includes a holding portion 21 for conduction (a holding portion/holder), a holding portion 31 for non-conduction (a holding portion/holder) that is lined up and spaced apart from the holding portion 21 for conduction in the width direction, and a linking portion 22 configured to link upper ends of both holding portions 21 and 31. The holding portion 21 for conduction is provided with a positioning recess 23 having such a shape that an outer surface that is opposite to the holding portion 31 for non-conduction is recessed to an arc shape. The curvature of the positioning recess 23 of the holding portion 21 for conduction is set to a curvature that is substantially equal to those of the outer circumferential surfaces of the conductors 16u, 16v, and 16w. The holding portion 31 for non-conduction is provided with a positioning recess 23 having such a shape that an outer surface that is opposite to the holding portion 21 for conduction is recessed to an arc shape. The curvature of the positioning recess 23 of the holding portion 31 for non-conduction is set to a curvature that is substantially equal to those of the outer circumferential surfaces of the insulating coatings 12u, 12v, and 12w.

An annular magnetic core 24 whose axis is oriented approximately in parallel to the axes of the covered electrical conductors 13u, 13v, and 13w is fixed to an inner surface of the lower end portion of the holding portion 21 for conduction, the inner surface being opposite to the holding portion 31 for non-conduction. A connecting electrical conductor 25 having conductivity is integrated with the holding portion 21 for conduction through insert molding, for example. The connecting electrical conductor 25 is a single component having an arc-shaped connection portion 26 embedded in the holding portion 21 for conduction and a curved leg 27 extending from the outer circumferential surface of the connection portion 26. The inner circumferential surface of the connection portion 26 is a curved surface having a curvature that is the same as that of the inner circumferential surface of the positioning recess 23, and the inner circumferential surface of the connection portion 26 is exposed on and flush with the inner circumferential surface of the positioning recess 23. A portion of the leg 27 that protrudes outward from the holding portion 21 for conduction is inserted into a central hole 28 of the magnetic core 24.

The noise filter 15 also includes three inductors 33u, 33v, and 33w, in addition to the three capacitors 17u, 17v, and 17w. The inductor 33u for the U phase (an inductor) is connected to an end portion of the conductor 16u for the U phase on the motor 40 side, the inductor 33v for the V phase (an inductor) is connected to an end portion of the conductor 16v for the V phase on the motor 40 side, and the inductor 33w for the W phase (an inductor) is connected to an end portion of the conductor 16w for the W phase on the motor 40 side.

Each of the inductors 33u, 33v, and 33w is constituted by one connecting electrical conductor 25 and one magnetic core 24 enveloping the connecting electrical conductor 25. The inductor 33u for the U phase and the inductor 33v for the V phase are integrated with the first positioning member 20, and the inductor 33w for the W phase is integrated with the second positioning member 30.

The end portion of the covered electrical conductor 13u for the U phase is fitted to the positioning recess 23 of one of the pair of holding portions 21 for conduction that are formed in the first positioning member 20, and the end portion of the covered electrical conductor 13v for the V phase is fitted to the positioning recess 23 of the other holding portion 21 for conduction. When these ends portions are fitted to the holding portions 21 for conduction, the end portion of the covered electrical conductor 13u for the U phase and the end portion of the covered electrical conductor 13v for the V phase are positioned, keeping a certain mutual positional relationship. Also, the outer circumferential surface of the conductor 16u for the U phase and the outer circumferential surface of the conductor 16v for the V phase are in surface contact with the inner circumferential surface of the connection portion 26 of the connecting electrical conductor 25. Accordingly, one end portion of the inductor 33u for the U phase is connected to the capacitor 17u for the U phase, and one end portion of the inductor 33v for the V phase is connected to the capacitor 17v for the V phase.

The end portion of the above-described covered electrical conductor 13v for the V phase is fitted to the positioning recess 23 of the holding portion 31 for non-conduction of the second positioning member 30. The covered electrical conductor 13v for the V phase is held between the first positioning member 20 and the second positioning member 30 in the width direction. Also, the end portion of the covered electrical conductor 13w for the W phase is fitted to the positioning recess 23 of the holding portion 21 for conduction of the second positioning member 30. Accordingly, the end portion of the covered electrical conductor 13w for the W phase is positioned with respect to the end portion of the covered electrical conductor 13u for the U phase and the end portion of the covered electrical conductor 13v for the V phase, keeping a certain mutual positional relationship. Also, when the outer circumferential surface of the conductor 16w for the W phase is brought into surface contact with the inner circumferential surface of the connection portion 26 of the connecting electrical conductor 25, one end portion of the inductor 33w for the W phase is connected to the capacitor 17w for the W phase.

The first positioning member 20, the second positioning member 30, and the end portions of the three covered electrical conductors 13u, 13v, and 13w are integrated by a binding member 34 such as adhesive tape or a binding band in a state in which they are kept from separating. Accordingly, the capacitor 17u for the U phase, the capacitor 17v for the V phase, and the capacitor 17w for the W phase are integrated together, and the end portions of the three capacitors 17u, 17v, and 17w have a certain mutual positional relationship. Also, the inductor 33u for the U phase, the inductor 33v for the V phase, and the inductor 33w for the W phase are integrated together, and the three inductors 33u, 33v, and 33w have a certain mutual positional relationship.

Furthermore, the end portion of the inductor 33u for the U phase that is opposite to the capacitor 17u for the U phase and the end portion of the inductor 33v for the V phase that is opposite to the capacitor 17v for the V phase are electrically connected by a covered electric wire 35 routed between leading end portions of both legs 27. Also, the end portion of the inductor 33v for the V phase that is opposite to the capacitor 17v for the V phase and the end portion of the inductor 33w for the W phase that is opposite to the capacitor 17w for the W phase are electrically connected by a covered electric wire 36 routed between leading end portions of both legs 27. Accordingly, the three inductors 33u, 33v, and 33w are star-connected. Furthermore, the three inductors 33u, 33v, and 33w are connected to a motor case 41 (a housing earth 44) by a housing connection wire 37 connected to the leg 27 of the inductor 33w for the W phase.

The shield layer 38 is a metal tubular member constituted by braided wires or the like. One end portion of the shield layer 38 is located near the motor 40 and is conductively connected to the motor case 41. The other end portion of the shield layer 38 is located near the inverter apparatus 42 and is conductively connected to the inverter case 43. Moreover, a space enveloped by the shield layer 38 serves as a shield space. The shield layer 38 collectively envelopes the three covered electrical conductors 13u, 13v, and 13w and the two positioning members 20 and 30.

The conductive path A with noise filter according to Embodiment 1 includes three covered electrical conductors (the covered electrical conductor 13u for the U phase, the covered electrical conductor 13v for the V phase, and the covered electrical conductor 13w for the W phase), and the three conductive path main bodies (the U phase wire 11u, the V phase wire 11v, and the W phase wire 11w) are respectively enveloped by insulating layers (the insulating coating 12u for the U phase, the insulating coating 12v for the V phase, and the insulating coating 12w for the W phase). The three conductors (the conductor 16u for the U phase, the conductor 16v for the V phase, and the conductor 16w for the W phase) for respectively forming capacitors (the capacitor 17u for the U phase, the capacitor 17v for the V phase, and the capacitor 17w for the W phase) between the conductive path main bodies (the U phase wire 11u, the V phase wire 11v, and the W phase wire 11w) are fixed to the outer circumferential surfaces of the covered electrical conductors 13u, 13v, and 13w.

Moreover, the end portions of the three covered electrical conductors 13u, 13v, and 13w including the capacitors 17u, 17v, and 17w on the motor 40 side are attached to the two positioning members 20 and 30, and thereby positioned in a state in which relative displacement between them is restricted. When these end portions are positioned by the positioning members 20 and 30, positional relationships between the covered electrical conductors 13u, 13v, and 13w, and their electrostatic capacitances and inductances are stabilized, and thus a frequency component that causes surge noise becomes constant. The electrostatic capacitances of the capacitors 17u, 17v, and 17w and the inductances of the inductors 33u, 33v, and 33w are set in correspondence with this frequency. Accordingly, the capacitors 17u, 17v, and 17w and the inductors 33u, 33v, and 33w exhibit the expected surge suppression effect. Note that if the shield layer 38 is fixed to the covered electrical conductors 13u, 13v, and 13w, the positional relationships between the covered electrical conductors 13u, 13v, and 13w and the shield layer 38 are stabilized, and thus a surge suppression effect is exhibited that is similar to the above.

Note that the electrostatic capacitances of the capacitors 17u, 17v, and 17w can be set by selecting, as appropriate, the lengths of the conductors 16u, 16v, and 16w, the areas of the conductors 16u, 16v, and 16w corresponding with the conductive path main bodies (the U phase wire 11u, the V phase wire 11v, and the W phase wire 11w), the distances between the conductors 16u, 16v, and 16w and the conductive path main bodies (the U phase wire 11u, the V phase wire 11v, and the W phase wire 11w), and the materials of the insulating coating 12u for the U phase, the insulating coating 12v for the V phase, and the insulating coating 12w for the W phase, for example. Also, the inductances of the inductors 33u, 33v, and the 33w can be set by changing the material and the size of the magnetic core 24, for example. Setting these makes it possible to effectively reduce surge noise in a specific frequency band by LC resonance.

Also, the conductive path A with noise filter includes a plurality of inductors 33u, 33v, and 33w that are respectively connected to the three conductors 16u, 16v, and 16w, and the three inductors 33u, 33v, and 33w are fixed to the positioning members 20 and 30. According to this configuration, the inductors 33u, 33v, and 33w and the positioning members 20 and 30 can be easily handled when they are transported.

Also, the positioning members 20 and 30 are provided with a plurality of holding portions 21 and 31 for holding the covered electrical conductors 13u, 13v, and 13w in a state in which the covered electrical conductors 13u, 13v, and 13w are positioned, the inductors 33u, 33v, and 33w are provided with the connection portion 26 that is in contact with the conductors 16u, 16v, and 16w in a state in which the covered electrical conductors 13u, 13v, and 13w are held by the holding portions 21 and 31. According to this configuration, when the covered electrical conductors 13u, 13v, and 13w are held by the holding portions 21 and 31, the conductors 16u, 16v, and 16w are connected to the inductors 33u, 33v, and 33w, and thus an operation for connecting the conductors 16u, 16v, and 16w and the inductors 33u, 33v, and 33w is not required.

Also, a terminal board (not shown) on the motor 40 side is disposed apart in the width direction due to reasons such as prevention of a short circuit, for example. Thus, the end portions of the covered electrical conductors 13u, 13v, and 13w on the motor 40 side are routed spaced apart from each other in the width direction. Spaces between the covered electrical conductors 13u, 13v, and 13w that are adjacent in this width direction are dead spaces. Focusing on this point, in this embodiment, the inductors 33u, 33v, and 33w are disposed between two adjacent covered electrical conductors 13u, 13v, and 13w. That is, the dead spaces between two adjacent covered electrical conductors 13u, 13v, and 13w are effectively utilized as spaces for disposing the inductors 33u, 33v, and 33w.

Other Embodiments

The present disclosure is not limited to the embodiment described above using the foregoing description and drawings, and embodiments such as the following are also encompassed in the technical scope of the present disclosure.

(1) Although the capacitors and the inductors are positioned by the positioning members in the above-described embodiment, only the capacitors may also be positioned by them.

(2) Although the conductive path main body is constituted by a flexible twisted wire having a circular cross-section in the above-described embodiment, the conductive path main body may also be a bus bar that does not easily deform, or a flat cable in which a plurality of electrical wires are arranged in parallel, for example.

(3) Although the number of covered electrical conductors that constitute the conductive path is three in the above-described embodiment, the number of covered electrical conductors that constitute the conductive path may also be two, four, or more.

(4) Although three covered electrical conductors constitute a three-phase AC circuit in the above-described embodiment, the present disclosure can also be applied to circuits other than the three-phase AC circuit.

(5) Although in the above-described embodiment, the conductor has a configuration in which the conductor corresponds with a part of the outer circumferential surface of the conductor main body in its circumferential direction, a configuration may also be adopted in which the conductor envelopes the conductor main body over its entire circumferential surface.

(6) Although the inductors include a magnetic core such as a ferrite core in the above-described embodiment, the inductors may also be obtained by molding metal single core wire or a metal twisted wire to a coil shape.

(7) Although the inductors are disposed between two adjacent covered electrical conductors in the above-described embodiment, the inductors may also be disposed at positions that constitute a triangle with respect to two adjacent covered electrical conductors.

(8) Although the housing connection wire is connected to the motor case in the above-described embodiment, the housing connection wire may also be directly connected to a body of a vehicle, instead of the motor case.

(9) Although the inductors are accommodated in the shield layer in the above-described embodiment, the inductors may also be disposed outside the shield layer.

(10) Although the plurality of conductive path main bodies are collectively enveloped by the shield layer in the above-described embodiment, a configuration may also be adopted in which such a shield layer is not provided.

(11) Although the three inductors are star-connected in the above-described embodiment, the inductors may also be delta-connected.

(12) Although the inductors are disposed on the motor side and these inductors are connected to only the motor case in the above-described embodiment, a configuration may also be adopted in which an inductor is provided on the inverter apparatus side, in addition to the inductors disposed on the motor side, and this inductor provided on the inverter apparatus side is connected to the inverter case.

(13) Although each conductor is a metal sheet in the above-described embodiment, the conductor may also be a tubular or tape-shaped metal foil, a braided wire, a metal bus bar, a metal twisted wire, a metal single core wire, a material obtained by plating the surface of a core material, a conductive resin, or a conductive rubber, for example.

(14) Although the conductive path main body with noise filter is routed between the motor and the inverter apparatus in the above-described embodiment, the present disclosure can also be applied to a case where the conductive path main body with noise filter is connected to a device other than the motor and the inverter apparatus.

The invention claimed is:

1. A conductive path provided with a noise filter, the conductive path comprising:
    a plurality of covered electrical conductors that are obtained by enveloping a plurality of conductive path main bodies with insulating layers;
    a plurality of conductors that are individually fixed to outer circumferential surfaces of the insulating layers, capacitors being formed individually between the plurality of conductors and the plurality of conductive path main bodies;
    a body having a holder;
    a plurality of arc-shaped positioning recesses that are formed in the holder and are configured to respectively keep the plurality of covered electrical conductors positioned;
    a plurality of inductors that are respectively connected to the plurality of conductors and are fixed to the body; and
    a connector that is formed on the plurality of inductors, the connector being: (i) exposed in an arc shape on an inner circumferential surface of the plurality of arc-shaped positioning recesses, (ii) in contact with the plurality of conductors in a state in which the plurality of covered electrical plurality of conductors are held in the plurality of arc-shaped positioning recesses, and (iii) in contact with an angular magnetic core.

2. The conductive path provided with the noise filter according to claim 1, wherein
    the plurality of inductors include a connecting electrical conductor having the connector, and
    the angular magnetic core envelopes the connecting electrical conductor.

3. The conductive path provided with the noise filter according to claim 1, wherein the plurality of inductors are disposed between two adjacent covered electrical conductors of the plurality of covered electrical conductors.

* * * * *